United States Patent [19]
Ricotti et al.

[11] Patent Number: 5,811,994
[45] Date of Patent: Sep. 22, 1998

[54] ELECTRICALLY CONTROLLED BIDIRECTIONAL AC SWITCH, AND AN INTEGRATED CIRCUIT AND ELECTRONIC CARD INCORPORATING THE SWITCH

[75] Inventors: Giulio Ricotti, Broni; Roberto Bardelli, Milan; Domenico Rossi, Cilavegna, all of Italy

[73] Assignee: SGS-Thomson Microelectronics, S.r.l., Agrate Brianza, Italy

[21] Appl. No.: 671,709

[22] Filed: Jun. 28, 1996

[30] Foreign Application Priority Data

Jun. 30, 1995 [EP] European Pat. Off. .............. 95830277

[51] Int. Cl.$^6$ ..................................... H03K 19/20
[52] U.S. Cl. ......................... 327/104; 327/588; 327/425; 323/266; 363/124
[58] Field of Search .................................... 323/266, 282, 323/355; 327/425, 29, 30, 104, 404, 588; 363/20, 24, 25, 124

[56] References Cited

U.S. PATENT DOCUMENTS

| 4,168,477 | 9/1979 | Burchall | 323/23 |
|---|---|---|---|
| 5,010,261 | 4/1991 | Steigerwald | 327/404 |
| 5,321,597 | 6/1994 | Alacoque | 365/25 |
| 5,430,639 | 7/1995 | Takahashi | 363/124 |

FOREIGN PATENT DOCUMENTS

| 2 445 662 | 12/1979 | European Pat. Off. . |
|---|---|---|
| 0 281 142 A2 | 9/1988 | European Pat. Off. . |
| 0 505 283 A2 | 9/1992 | European Pat. Off. . |
| 0 620 646 A1 | 10/1994 | European Pat. Off. . |

*Primary Examiner*—Timothy P. Callahan
*Assistant Examiner*—Jung Ho Kim
*Attorney, Agent, or Firm*—David V. Carlson; Bryan A. Santarelli; Seed and Berry LLP

[57] ABSTRACT

The switch of this invention has two conduction terminals and basically consists of the parallel coupling, across the two conduction terminals, of a first N-channel MOS transistor and second P-channel MOS transistor. The first MOS transistor will be conducting when the signal applied to the conduction terminals has a first polarity, and the second MOS transistor will be conducting when the signal applied to the conduction terminals has a second polarity. Advantageously, if two unidirectional conduction circuit elements are respectively connected in series with the main conduction paths of the two MOS transistors, the drain/body junctions of the latter will never be conducting regardless of the way the switch is connected.

19 Claims, 3 Drawing Sheets

5,811,994

1

ELECTRICALLY CONTROLLED BIDIRECTIONAL AC SWITCH, AND AN INTEGRATED CIRCUIT AND ELECTRONIC CARD INCORPORATING THE SWITCH

TECHNICAL FIELD

This invention relates to an electrically controlled switch effective to interrupt signals of variable polarity, and to an integrated circuit and electronic card incorporating the switch.

BACKGROUND OF THE INVENTION

The interruption of electric signals of the bipolar type, especially where no stringent limitations are imposed on the magnitude of such signals, is a problem that admits of no straightforward solutions, particularly if simple circuit design solutions are sought.

The problem is further compounded where the switch is to be provided in integrated form, since problems from the substrate bias and the process wells must then be addressed at one time.

A switch of this kind is needed, for example, in electronic cards, especially cards of the contact-less type. Such cards and their operation are described, for example, in Patent Application EP 0 602 449. The card provides for the switching of a load connected in parallel to a resonant circuit which usually comprises a coil and a capacitor connected in parallel. Patent Application EP 0 602 448, a related one to the former, discloses how to control the load switching. Also, a method for manufacturing a card of that kind is disclosed in Patent Application EP 0 587 011.

These electronic cards perform their data storage, reception and/or transmission functions when coupled to a base station which is capable of transmitting and/or receiving both modulated and unmodulated RF signals.

SUMMARY OF THE INVENTION

It is an object of this invention to provide a circuit design for an electrically controlled switch of the bipolar type, in particular a switch adapted to be integrated.

The invention further concerns an integrated circuit and electronic card wherein the inventive switch can be used to advantage.

The switch of this invention has two conduction terminals and is substantially formed by coupling in parallel, across the conduction terminals, a first MOS transistor of the N-channel type and second MOS transistor of the P-channel type. The first MOS transistor is conducting when the signal applied to the conduction terminals has a first polarity, and the second MOS transistor is conducting when the signal applied to the conduction terminals has a second polarity.

Advantageously, by respectively connecting two unidirectional conduction circuit elements in series with the main paths of conduction of the two MOS transistors, the drain/body junctions of the two MOS transistors will never become conductive regardless of how the switch is connected.

BRIEF DESCRIPTION OF THE DRAWINGS

The invention can be more clearly appreciated from the following description, to be read in conjunction with the accompanying drawings, in which.

2

Figure 2:
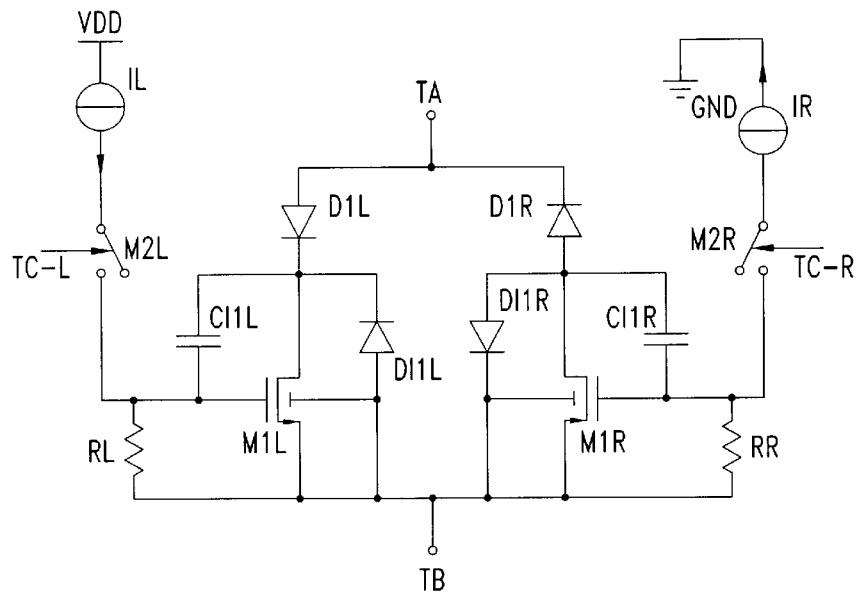
Figure 3:
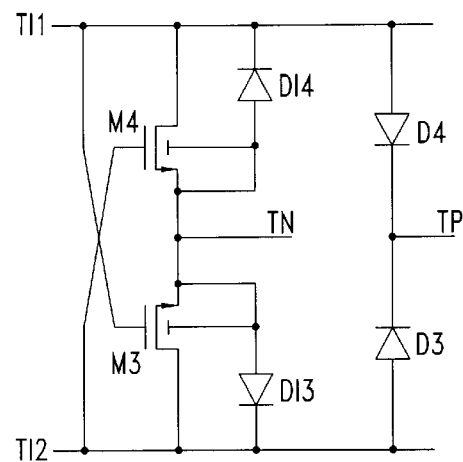
Figure 4:
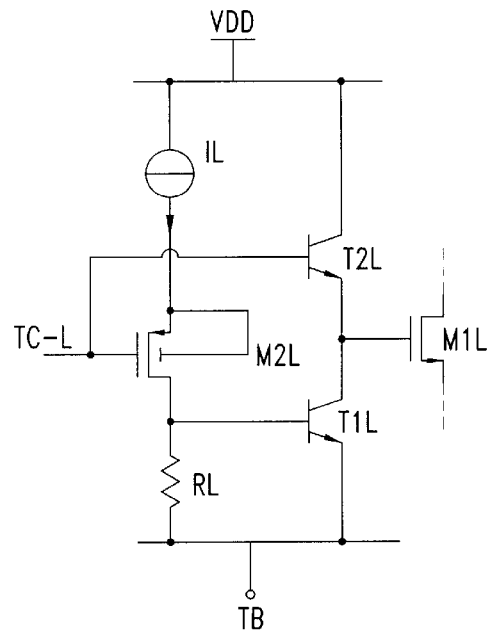
Figure 5:
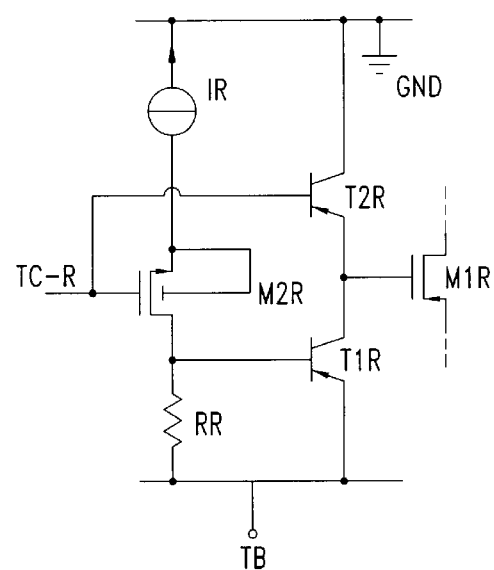

FIG. 2 shows a circuit diagram for a switch according to the invention,

FIG. 3 shows a circuit diagram for a rectifier to be used in combination with a switch according to the invention, FIG. 4 shows a circuit diagram for a first driver network useful with a switch according to the invention, and FIG. 5 shows a circuit diagram for a second driver network useful with a switch according to the invention.

DETAILED DESCRIPTION OF THE INVENTION

Figure 1:
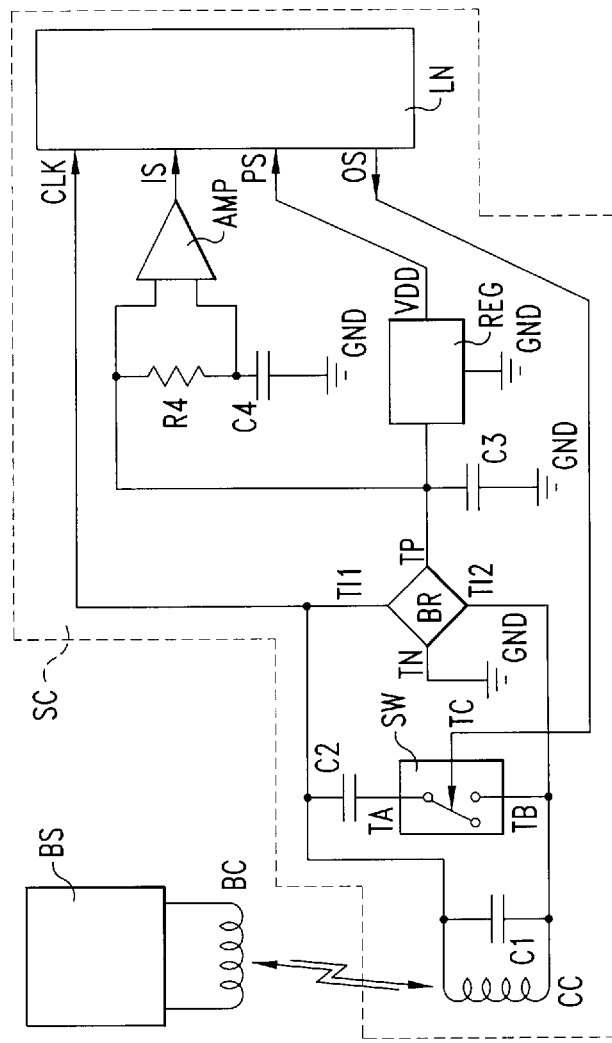
FIG. 1 is a block diagram of a transmission system which includes an electronic card according to the invention.

FIG. 1 shows a whole transmission system: indicated at BS is the base station, at BC a coil used as an antenna for the station BS, at SC the electronic card, and at CC a coil used as an antenna for the card SC and forming, together with a capacitor C1, the resonant circuit. The remaining circuitry is preferably formed in one or more integrated circuits. If the capacitance of the capacitor C1 is not too high, then the capacitor can also be integrated. Where the coils BC and CC approach each other with respect to the wavelength of the RF signal, electric signals can be transferred between the station BS and the card SC. In this condition, the behavior of the coils may be likened to that of a transformer.

Energy is received through the resonant circuit in the form of an unmodulated RF signal for the operation of the card (this energy should enable operation of the card for a sufficient time to permit reception and/or transmission of data), a modulated RF signal carrying data of interest to the card is received, and an unmodulated RF signal is received for the card to transmit data.

The card transmission takes place as follows: the resonant circuit of the card SC is normally tuned on the transmission frequency of the station BS. If the resonance parameters of the circuit are changed, the station BS can recognize this because the change will result in the flow of current and/or the voltage generated across the coil BC also being changed, similar to what occurs in the primary winding of a transformer when, for instance, the load connected to the secondary winding of the transformer is altered. If the change in resonance parameters is effected by the circuitry of the card SC in a timed fashion following a data signal, the station BS will be able to "receive" such data "transmitted" from the card SC.

The switch of this invention has, as shown in FIG. 2, a first conduction terminal TA and second conduction terminal TB, and at least one control terminal TC, and comprises a first MOS transistor M1L of the N-channel type and a second MOS transistor M1R of the P-channel type, which are connected such that their main conduction paths are coupled together in parallel, and which have their gate terminals coupled to the control terminal TC. Shown in FIG. 2 are two control terminals TC-L and TC-R which are respectively coupled to the gate terminals of the transistors M1L and M1R. From a logic standpoint, the terminals TC-L and TC-R in FIG. 2 are coincident, whereas from an electric standpoint they may be coincident or non-coincident, according to how the circuits connected thereto are formed electrically.

Also shown in FIG. 2 are intrinsic and/or parasitic circuit elements associated with the MOS transistors. The transistor M1L has a drain/body junction or diode DI1L and a gate/drain capacitor CI1L. The transistor M1R has a drain/body junction or diode DI1R and a gate/drain capacitor CI1R.

In the switch of FIG. 2, the source terminals and body terminals of the transistors M1L and M1R are connected to each other. In order to prevent current from drifting past the junctions DI1R and DI1L, first D1L and second D1R unidirectional conduction circuit elements are inserted which are coupled in series to the main conduction paths of the transistors M1L and M1R, respectively. These elements D1L and D1R may be simple diodes as shown in FIG. 2.

The transistors are turned on and off in relation to the signal present on the control terminals TC-L and TC-R. For this purpose, the switch of FIG. 2 includes first and second driver networks of similar design, respectively for the first transistor M1L and the second transistor M1R, which are effective to generate suitable gate/source voltages. The first driver network comprises the connection, in series between a supply voltage reference VDD and the terminal TB, of a first current generator IL, a first controlled monopolar switch M2L having a control terminal connected to the control terminal TC-L, and a first resistor RL connected in parallel to the gate/source pair of the transistor M1L. The second driver network comprises the connection, in series between the terminal TB and a ground potential reference GND, of a second current generator IR, a second controlled monopolar switch M2R having a control terminal connected to the control terminal TC-R, and a second resistor RR connected in parallel to the gate-source pair of the transistor M1R.

The switches M2L and M2R may be simply comprised of two MOS transistors of the P-channel and N-channel types, respectively. Two alternatives exist in this case: either the switch is provided with two control terminals TC-L and TC-S which must be supplied two logic signals being inverted from each other, or the switch is provided with only one control terminal TC which is supplied a single logic signal, and within the switch, an inverter is used to generate the two inverted logic signals.

Still referring to FIG. 2, when the switches are closed, the current from the generators IL and IR flows mainly through the resistors RL and RR, respectively, and assuming that these four circuit elements have been suitably sized, the voltage VGS at the transistors M1L and M1R will be such as to allow them to conduct, thereby establishing the closed switch state. Actually, when the signal applied to the terminals TA and TB has positive polarity with respect to the terminal TB, only the transistor M1L will be on, and transistor M1B be off, whereas when the signal applied to the terminals TA and TB has negative polarity with respect to the terminal TB, only the transistor M1R will be on, and transistor M1L be off. On the other hand, with the switches M2L and M2R open, substantially no current flows through the resistors RL and RR, and the voltage VGS at the transistors M1L and M1R is substantially zero, so that these transistors will be off, and regardless of the signal applied across the terminals TA and TB, no current flows through the switch according to the invention, thereby establishing the open switch state. Without the diodes D1L and D1R, the body/drain junctions DI1L and DI1R of the MOS transistors would be forward biased when the signal across the terminals TA and TB has negative and positive polarity, respectively, so that the switch would be closed when it is supposed to be open, and thus fail to perform its desired function.

The series resistance of the switch is, depending on operating conditions, either equal to the RDS of the N-channel MOS transistor when on, or the RDS of the P-channel MOS transistor when on, or the parallel combination of the two RDSs.

The current generated by the generators IL and IR should be small, in order to have a small current expended for the biasing, which implies high resistive values for the resistors RL and RR. Also, the switch operation should be unaffected by the currents injected into the gate terminals of the MOS transistors M1L and M1R, respectively, through the capacitors CI1L and CI1R. That is, the voltages generated by such currents across the resistors RL and RR should be lower than the threshold voltages of M1L and M1R, respectively, which implies low resistive values for the resistors RL and RR.

The values of the generators IL, IR and the resistors RL, RR should be selected to compromise between the above conflicting requirements.

The circuit diagram of a version, slightly more complicated but much more effective than the first and second driver networks, is respectively shown in FIGS. 4 and 5.

Each of these networks comprises two transistors of the bipolar type, additionally to the three circuit elements already described.

Referring to FIG. 4, the first network further comprises a first BJT transistor T1L of the NPN type which has its base/emitter junction connected in parallel to the resistor RL and its collector/emitter pair connected in parallel to the gate/source pair of the MOS transistor M1L.

Through the transistor T1L, when turned on, any currents due to the capacitor CI1L would almost be shorted to ground and originate no significant VGS.

The first network may further comprise a second BJT transistor T2L of the NPN type which has its emitter terminal connected to the collector terminal of the transistor T1L, base terminal connected to the terminal TC-L, and collector terminal connected to the reference VDD.

Through the transistor T2L in the on state, the reference potential VDD is applied directly to the gate terminal of the transistor M1L, which will then be turned on by a minimal current since the transistor T1L is in the off state.

The driving of the transistors T1L and T2L is effected by means of the three circuit elements described above.

The driver circuit should be sized in the light of the considerations already made in connection with the overall current consumption and spurious turning on of the transistors M1L, T1L and T2L.

It can be shown that an acceptable compromise is much more easily struck if the bipolar transistors are provided.

With reference to FIG. 5, the second network further comprises a first BJT transistor T1R of PNP type which has its base/emitter junction connected in parallel to the resistor RR and the collector/emitter pair connected in parallel to the gate/source pair of the MOS transistor M1R, and a second BJT transistor T2R of PNP type having its emitter terminal connected to the collector terminal of the transistor T1R, base terminal connected to the terminal TC-R, and collector terminal connected to the reference GND.

A switch of this kind can be readily implemented in integrated form. An appropriate choice is to connect, for example, the ground reference GND to the substrate of the integrated circuit.

An integrated circuit affected at least by variable polarity signals may advantageously include one or more switches according to the invention for controllably interrupting the signals. Besides the switch, the integrated circuit will generally include other circuitry as well.

With integrated circuits of this kind, it is important to find the appropriate circuitry node to be connected to the substrate. Since electronic components often must be inserted into different process wells which are isolated from one another, using the "junction isolation" technique, it is necessary that one or more of such junctions are in the conducting state. In the instance of a P-doped substrate, it is desirable that the substrate be connected to the circuit node that will take the lowest potential while in operation. With circuits driven by monopolar signals, this would be ground. But this would not be true in general with varying polarity signals.

If a bridge rectifier, such as that denoted by BR in FIG. 1, is integrated to the circuit together with a switch according to the invention, such as that denoted by SW in FIG. 1, one has the choice of connecting the negative terminal TN of the bridge BR to the substrate.

However, for this to be effective, the potential at the terminal TI2 should not be less than about −700 millivolts with respect to the terminal TN. Such a result can be obtained with the circuit shown in FIG. 3.

The bridge rectifier of FIG. 3 has two indifferent terminals TI1 and TI2, a positive terminal TP, and a negative terminal TN, and is comprised of four legs. The two legs connected to the terminal TN respectively include two N-channel MOS transistors M3 and M4, and the terminal TN is used for the ground potential reference GND.

In FIG. 3, the transistor M3 has a source terminal connected to its body terminal and the terminal TN, a drain terminal connected to the terminal TI2, and a gate terminal connected to the terminal TI1. The transistor M4 has a source terminal connected to its body terminal and the terminal TN, a drain terminal connected to the terminal TI1, and a gate terminal connected to the terminal TI2. Also shown are intrinsic diodes DI3 and DI4, respectively connected between the body and drain terminals of the transistors M3 and M4.

The other two legs of the rectifier are formed, in the circuit of FIG. 3, by two diodes D3, D4 respectively connected between the terminals TI2, TI1 and TP.

The use of the MOS transistors, in lieu of the traditional diodes, allows the voltage drop across the terminals TN and TI2 to be kept as low as 300 or 400 millivolts, provided that the transistor M3 is suitably sized—the maximum voltage drop being equal to the RDS of the transistor M3, as turned on, multiplied by the maximum current supplied by the bridge. The range 300–400 millivolts to 700 millivolts provides sufficient margin to ensure isolation.

This substrate bias also allows proper operation of the switch according to the invention.

As previously mentioned, electronic cards represent one field of application of the invention.

Shown at SC in FIG. 1 is an electronic card of this kind.

The card SC includes a resonant circuit—consisting, for example, of a coil CC and a capacitor C1 connected in parallel—for receiving and/or transmitting signals, and an electric network effective to vary at least one resonance parameter, e.g. the resonance frequency or the merit factor of the resonant circuit, if coupled to the latter.

The variation in resonance frequency may serve, as previously explained, to "transmit" data to the station BS, or receive data from different stations operated at different frequencies.

The coupling of the resonant circuit to the network may advantageously be established on command through a switch according to the invention. The switch, in fact, will interrupt incoming signals with varying polarity and hard-to-foresee amplitude, usually of a few volts.

In FIG. 1, the electric network is shown to simply comprise a capacitor C2 which is connected on command in parallel to the resonant circuit through the switch SW. Specifically, the terminal TB is connected to a first terminal of the capacitor C1, and the terminal TA connected to a first terminal of the capacitor C2, a second terminal of the capacitor C2 being connected to a second terminal of the capacitor C1.

In a known manner, the card SC requires additional circuitry for its function, which circuitry is only schematically shown in FIG. 1. The core of the card SC is the logic network LN which, as is well known, usually consists basically of a processor and memories of the RAM, ROM, EEPROM, or FLASH types.

The network LN is usually input at least one clock signal CLK and a power supply signal PS, and may further receive an input data signal IS and/or generate an output data signal OS.

Such signals are generated by further circuitry on the card. This circuitry includes at least one rectifier BR which may be the one shown in FIG. 3, a satisfactory performer in combination with the switch of FIG. 2.

The terminals TI1 and TI2 are parallel connected to the resonant circuit. The terminal TN of the rectifier BR functions as the ground potential reference GND, while the terminal TP of the rectifier BR may function as the supply voltage reference VDD. Actually, it is expedient to provide a capacitor C3 and regulator REG after the rectifier in order for the reference potential VDD to be sufficiently stable to permit reliable operation of the logic circuitry powered therefrom. The aggregate of the rectifier BR, capacitor C3, and regulator REG form a stabilized power supply.

As mentioned, the switch SW also need be powered, which can be arranged to advantage from that supply.

The signal OS can be sent directly to the control terminal TC of the switch SW to obtain the transmission effect whenever desired.

The signal CLK can be derived from the potential present on the terminal TI1 of the rectifier BR.

The signal IS can be derived from the potential on the terminal TP of the rectifier BR, via a peak detector. This detector may comprise, for example, the serial connection, between the terminal TP and the reference GND, of a resistor R4 and a capacitor C4, and a differential amplifier AMP having inputs connected across the resistor R4 and an output connected to the output of the peak detector.

It would be advantageous if the whole circuitry of the card SC could be integrated into a single integrated circuit, or in the extreme, to a few integrated circuits. The most difficult components to integrate are the capacitors C1, C2, C3, and especially the coil CC.

Where at least the switch SW and rectifier BR are integrated on the same integrated circuit, it is as mentioned expedient to arrange for the terminal TN to be connected to its substrate, which will then function as the ground potential reference GND for the remaining circuitry of the card SC.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. An electrically controlled switch of the bipolar type, comprising:

first and second conduction terminals and at least one control terminal;

a first N-channel MOS transistor and a second P-channel MOS transistor connected such that their main conduction paths are coupled together in parallel and having respective gate terminals;

first and second driver networks, respectively, for said first and said second MOS transistors, effective to generate suitable gate/source voltages; and wherein each of said driver networks comprises the serial connection of a current generator, a controlled switch of the monopolar type having a control terminal coupled to said at least one control terminal, and a resistor that is parallel coupled to the gate/source pair of a respective one of the MOS transistors.

2. A switch according to claim 1, further comprising a first and a second unidirectional conduction circuit element coupled in series to the main conduction paths of said first and second MOS transistors, respectively, whereby no current is allowed to flow through their drain/body junctions.

3. A switch according to claim 1 wherein each of said driver networks further comprises a first BJT transistor having its base/emitter junction coupled in parallel with said resistor and its collector/emitter pair parallel connected to the gate/source pair of a respective one of the MOS transistors.

4. A switch according to claim 3 wherein each of said driver networks further comprises a second BJT transistor having its emitter terminal coupled to the collector terminal of said first BJT transistor and base terminal coupled to said at least one control terminal.

5. A switch according to claim 1 and implemented in the integrated form, wherein one of the terminals of said current generator of one of said first and second divider networks is coupled to a substrate.

6. An integrated circuit, comprising:

an input for receiving a variable polarity signal; and at least one switch for interrupting on command said signal, the switch including, first and second conduction terminals and at least one control terminal;

a first N-channel MOS transistor and a second P-channel MOS transistor connected such that their main conduction paths are coupled together in parallel and having respective gate terminals;

first and second driver networks, respectively, for said first and said second MOS transistors, effective to generate suitable gate/source voltages; and wherein each of said driver networks comprises the serial connection of a current generator, a controlled switch of the monopolar type having a control terminal coupled to said at least one control terminal, and a resistor that is parallel coupled to the gate/source pair of a respective one of the MOS transistors.

7. An integrated circuit according to claim 6, further comprising a bridge rectifier having two indifferent terminals, a positive terminal and a negative terminal, with its two legs connected to the negative terminal including a MOS transistor each, wherein one of the terminals of said current generator of one of said first and second driver networks is coupled to a substrate, and wherein said negative terminal is also connected to the substrate.

8. An electronic card, comprising:

a resonant circuit for receiving and/or transmitting signals;

an electric network effective to vary at least one resonance parameter of said resonant circuit when the electric network is coupled to the resonant circuit;

at least one switch connected as to establish on command said coupling of said electric network to said resonant circuit, said switch including, first and second conduction terminals and at least one control terminal;

a first N-channel MOS transistor and a second P-channel MOS transistor connected such that their main conduction paths are coupled together in parallel and having gate terminals coupled to said at least one control terminal;

first and second driver networks, respectively, for said first and said second MOS transistors, effective to generate suitable gate/source voltages; and wherein each of said driver networks comprises the serial connection of a current generator, a controlled switch of the monopolar type having a control terminal coupled to said at least one control terminal, and a resistor that is parallel coupled to the gate/source pair of a respective one of the MOS transistors.

9. A card according to claim 8 wherein said electric network comprises a capacitor, said capacitor and said at least one switch being connected in series to each other and jointly connected in parallel to said resonant circuit.

10. A card according to claim 8 wherein said switch is powered from a supply circuit parallel connected to said resonant circuit.

11. A card according to claim 10, comprising at least one integrated circuit implementing said switch and said power supply, wherein said supply circuit comprises a bridge rectifier having two indifferent terminals, a positive terminal and a negative terminal, with its two legs connected to the negative terminal including a MOS transistor each, wherein one of the terminals of said current generator is coupled to the substrate of said integrated circuit, and wherein said negative terminal is connected to the substrate of said integrated circuit.

12. A method for allowing a signal to propagate between first and second nodes, comprising:

in response to an enable signal, activating first and second drive circuits that are coupled to the gate terminals of first and second transistors, respectively, to turn on said first and second transistors, which are each coupled between said first and second nodes, each of said drive circuits respectively including a current generator that is in series with a switch and a resistive element;

coupling said first node to said second node with said first transistor and substantially prohibiting current from flowing through said second transistor when said signal drives said first node more positive than said second node; and coupling said second node to said first node with said second transistor and substantially prohibiting current from flowing through said first transistor when said signal drives said second node more positive than said first node.

13. The method of claim 12 wherein:

said coupling said first node to said second node comprises serially coupling to said second transistor a first circuit element that allows current to flow only from said second node to said first node; and said coupling said second node to said first node comprises serially coupling to said first transistor a second circuit element that allows current to flow only from said first node to said second node.

14. An integrated circuit for use in a smart card, said integrated circuit comprising:

first and second supply terminals;

a transmit/receive coil having first and second terminals;

a first capacitor coupled in parallel with said coil;

a full-wave rectifier having first and second terminals coupled across said coil, a third terminal coupled to said first supply terminal, and a fourth terminal coupled to said second supply terminal;

a data detector having an input terminal coupled to said third terminal of said rectifier and having an output terminal;

a processor circuit having a clock terminal coupled to said first terminal of said coil, a data terminal coupled to said output terminal of said data detector, a power terminal coupled to said first supply terminal, and an output terminal;

a second capacitor having a first terminal coupled to said first terminal of said coil and having a second terminal; and a switch circuit having a first terminal coupled to said second terminal of said second capacitor, a second terminal coupled to said second terminal of said coil, and a control terminal coupled to said output terminal of said processor circuit, said switch circuit including,
an nmos transistor having a source coupled to said second terminal of said switch circuit, a gate, and a drain,
a first diode having a cathode coupled to said drain of said nmos transistor and an anode coupled to said first terminal of said switch circuit,
a first control circuit coupled between said control terminal and said gate of said nmos transistor,
a pmos transistor having a source couple to said second terminal of said switch circuit, a gate, and a drain;
a second diode having a cathode coupled to said first terminal of said switch circuit and an anode coupled to said drain of said pmos transistor, and
a second control circuit coupled between said control terminal and said gate of said pmos transistor.

15. The integrated circuit of claim 14 wherein:
said first control circuit comprises,
a first control input terminal coupled to said control terminal,
a first control output terminal coupled to said gate of said nmos transistor,
a first impedance element having a first terminal coupled to said second terminal of said switch circuit and having a second terminal,
a first current source and a first switch serially coupled between said first supply terminal and said second terminal of said impedance element, said switch having a control terminal coupled to said first control input terminal,
a first bipolar transistor having a collector/emitter junction coupled between said first supply terminal and said first control output terminal, said first bipolar transistor having a base coupled to said first control input terminal, and
a second bipolar transistor having a collector/emitter junction coupled between said second terminal of said switch circuit and said first control output terminal, said second bipolar transistor having a base coupled to said second terminal of said impedance element; and
said second control circuit comprises,
a second control input terminal coupled to said control terminal,
a second control output terminal coupled to said gate of said pmos transistor,
a second impedance element having a first terminal coupled to said second terminal of said switch circuit and having a second terminal,
a second current source and a second switch serially coupled between said second supply terminal and said second terminal of said second impedance element, said second switch having a control terminal coupled to said second control input terminal,
a third bipolar transistor having a collector/emitter junction coupled between said second supply terminal and said second control output terminal, said third bipolar transistor having a base coupled to said second control input terminal, and
a fourth bipolar transistor having a collector/emitter junction coupled between said second terminal of said switch circuit and said second control output terminal, said fourth bipolar transistor having a base coupled to said second terminal of said second impedance element.

16. The switch of claim 1 wherein:
said first driver network further comprises,
a first npn transistor having a base-emitter junction coupled in parallel with said respective resistor and having a collector coupled to said gate terminal of said first MOS transistor, and
a second npn transistor having a base coupled to said at least one control terminal, a collector coupled to said respective current generator, and an emitter coupled to said gate terminal of said first MOS transistor; and
said second driver network further comprises,
a first pnp transistor having a base-emitter junction coupled in parallel with said respective resistor and having a collector coupled to said gate terminal of said second MOS transistor, and
a second pnp transistor having a base coupled to said at least one control terminal, a collector coupled to said respective current generator, and an emitter coupled to said gate terminal of said second MOS transistor.

17. The method of claim 12 wherein:
said first drive circuit comprises,
a first current source coupled to a first supply terminal,
a first resistor coupled across a gate/source junction of said first transistor, and
a first switch coupled between said first current source and said first resistor and coupled to receive said enable signal; and
said second drive circuit comprises,
a second current source coupled to a second supply terminal,
a second resistor coupled across a gate/source junction of said second transistor, and
a second switch coupled between said second current source and said second resistor and coupled to receive said enable signal.

18. The method of claim 12 wherein:
said first drive circuit comprises,
a first npn transistor having a base coupled to receive said enable signal, a collector coupled to a first supply terminal, and an emitter coupled to a gate of said first transistor,
a second npn transistor having a base, a collector coupled to said gate of said first transistor, and an emitter coupled to said second node,
a first current source coupled to said first supply terminal, a first resistor coupled to said base of said second npn transistor and to said second node, and a first switch coupled between said first current source and said first resistor and coupled to receive said enable signal; and said second drive circuit comprises, a first pnp transistor having a base coupled to receive said enable signal, a collector coupled to a second supply terminal, and an emitter coupled to a gate of said second transistor, a second pnp transistor having a base, a collector coupled to said gate of said second transistor, and an emitter coupled to said second node, a second current source coupled to said second supply terminal, a second resistor coupled to said base of said second pnp transistor and to said second node, and a second switch coupled between said second current source and said second resistor and coupled to receive said enable signal.

19. The integrated circuit of claim 14 wherein:

said first control circuit comprises, a first control input terminal coupled to said control terminal, a first control output terminal coupled to said gate of said nmos transistor, a first current source coupled to said first supply terminal, a first resistor coupled to said first control output terminal and to said second terminal of said switch circuit, and a first switch coupled between said first current source and said first resistor and having a control terminal coupled to said first control input terminal; and said second control circuit comprises, a second control input terminal coupled to said control terminal, a second control output terminal coupled to said gate of said pmos transistor, a second current source coupled to said second supply terminal, a second resistor coupled to said second control output terminal and to said second terminal of said switch circuit, and a second switch coupled between said second current source and said second resistor and having a control terminal coupled to said second control input terminal.

* * * * *